US009899683B2

(12) United States Patent
Lee et al.

(10) Patent No.: US 9,899,683 B2
(45) Date of Patent: Feb. 20, 2018

(54) ELECTROLYTIC COPPER FOIL, ELECTRIC COMPONENT AND BATTERY INCLUDING THE SAME

(71) Applicant: ILJIN Materials Co., Ltd., Jeollabuk-do (KR)

(72) Inventors: Sun Hyoung Lee, Jeollabuk-do (KR); Tae Jin Jo, Gyeonggi-do (KR); Seul Ki Park, Jeollanam-do (KR); Ki Deok Song, Gyeonggi-do (KR)

(73) Assignee: Iljin Materials Co., Ltd., Jeollabuk-do (KR)

( * ) Notice: Subject to any disclaimer, the term of this patent is extended or adjusted under 35 U.S.C. 154(b) by 381 days.

(21) Appl. No.: 14/640,729

(22) Filed: Mar. 6, 2015

(65) Prior Publication Data

US 2016/0260980 A1    Sep. 8, 2016

(51) Int. Cl.
| | | |
|---|---|---|
| *B21C 37/00* | (2006.01) | |
| *H01M 4/66* | (2006.01) | |
| *C25D 1/04* | (2006.01) | |
| *C25D 3/38* | (2006.01) | |
| *H05K 1/09* | (2006.01) | |
| *H01M 10/052* | (2010.01) | |

(52) U.S. Cl.
CPC ............. *H01M 4/661* (2013.01); *C25D 1/04* (2013.01); *C25D 3/38* (2013.01); *H01M 10/052* (2013.01); *H05K 1/09* (2013.01); *H05K 2201/0355* (2013.01)

(58) Field of Classification Search
CPC ...... H01M 4/661; H01M 10/052; H05K 1/09; H05K 2201/0355; C25D 1/04; C25D 3/38; C25D 7/0614
See application file for complete search history.

(56) References Cited

U.S. PATENT DOCUMENTS

| | | | | |
|---|---|---|---|---|
| 5,833,819 | A * | 11/1998 | Ohara ....................... | C25D 1/04 |
| | | | | 204/206 |
| 8,722,199 | B2 * | 5/2014 | Matsuda .................. | C25D 1/04 |
| | | | | 205/291 |
| 9,365,942 | B2 * | 6/2016 | Tsai ......................... | C25D 1/04 |
| 2009/0166213 | A1 * | 7/2009 | Dobashi ................... | C25D 1/04 |
| | | | | 205/296 |

(Continued)

FOREIGN PATENT DOCUMENTS

KR     101478464 B1     2/2015

OTHER PUBLICATIONS

Machine Translation for Korean Application No. 10478464B1, Jan. 2, 2015.

(Continued)

*Primary Examiner* — David Sample
*Assistant Examiner* — Eizabeth Collister
(74) *Attorney, Agent, or Firm* — McDonnell Boehnen Hulbert & Berghoff LLP

(57) ABSTRACT

Disclosed herein is an electrolytic copper foil in which an average diameter of a pore which is a region between surface elements protruding from a matte side is 1 mm to 100 nm. The electrolytic copper foil has high elongation while maintaining low roughness and high strength and thus may be used in a current collector of a medium-large size lithium ion secondary battery and a semiconductor packaging substrate, and the like, for tape automated bonding (TAB) which is used in a tape carrier package (TCP).

15 Claims, 14 Drawing Sheets

(56) References Cited

U.S. PATENT DOCUMENTS

| | | | |
|---|---|---|---|
| 2012/0040241 A1* | 2/2012 | Kim | C25D 1/04 |
| | | | 429/209 |
| 2012/0189859 A1* | 7/2012 | Nozaki | B32B 15/08 |
| | | | 428/458 |

OTHER PUBLICATIONS

European Search Report for European counterpart serial No. 1518190.7 dated Nov. 9, 2015.

* cited by examiner

ELECTROLYTIC COPPER FOIL, ELECTRIC COMPONENT AND BATTERY INCLUDING THE SAME

BACKGROUND OF THE INVENTION

Field of the Invention

Exemplary embodiments of the present invention relate to an electrolytic copper foil, an electric component and a battery including the same, and more particularly, to a low-roughness, high-strength, and high-elongation electrolytic copper foil which has high tensile strength and elongation even after being subjected to high-temperature heat treatment.

Description of the Related Art

As a current collector of a secondary battery, a copper foil is generally used. As the copper foil, a rolling copper foil which is manufactured by rolling working has been mainly used, but manufacturing cost is expensive and it is difficult to manufacture a copper foil having a wide width. Further, the rolling copper foil has reduced adhesion to an active material due to pollution of lubricating oil since the lubricating oil needs to be used at the time of the rolling working, and thus charging and discharging cycle characteristics of the battery may be degraded.

A lithium battery is accompanied by a change in volume at the time of charging and discharging and a heat generation phenomenon due to overcharging. Further, the copper foil should have low surface roughness to improve adhesion to an electrode active material and to make a copper foil substrate be less affected by expansion and contraction of an active material layer during a charging and discharging cycle so as to prevent wrinkle, fracture, and the like from occurring on the copper foil as the current collector. Therefore, a need exists for a high-elongation, high-strength, and low-roughness copper foil which may bear a change in voltage and the heat generation phenomenon of a lithium battery and have excellent adhesion to an active material.

Further, to increase integration of a circuit within a small area to keep pace with high performance, miniaturization, and weight reduction according to a demand for compactness and miniaturization, a demand for micro patterning of a semiconductor mounting substrate or a main board substrate has been increased. When a thick copper foil is used to manufacture a print wiring board having the micro pattern, etching time for forming a wiring circuit is long and side wall verticality of a wiring pattern is reduced. In particular, when a line width of the wiring pattern formed by the etching is narrow, the wiring may be short-circuited. Therefore, to obtain a micro pitch circuit, a thinner copper foil is required. However, due to the required thinner copper foil, which has weak mechanical strength, the occurrence frequency of defects such as wrinkles and bending is increased at the time of manufacturing the printed wiring board.

Further, in a semiconductor packaging substrate, and the like, for tape automated bonding (TAB) which is used in a tape carrier package (TCP), a plurality of terminals of an IC chip are directly bonded to an inner lead which is placed at a device hall located in a center of the product, and in this case, a bonding device is used to make a current instantly flow therein to heat it and apply a constant pressure thereto. Therefore, the inner lead formed by the etching of the electrolytic copper foil is pulled by a bonding pressure and is thus stretched.

Therefore, a low-roughness copper foil which may have a thin thickness, high mechanical strength, and high elongation is required.

SUMMARY OF THE INVENTION

An object of the present invention is to provide a new electrolytic copper foil.

Another object of the present invention is to provide an electric component including an electrolytic copper foil.

Yet another object of the present invention is to provide a battery including an electrolytic copper foil.

Other objectives and advantages of the present invention can be understood by the following description, and become apparent with reference to the embodiments of the present invention. Also, it is obvious to those skilled in the art to which the present invention pertains that the objectives and advantages of the present invention can be realized by the means as claimed and combinations thereof.

In accordance with one aspect of the present invention, there is provided an electrolytic copper foil in which an average diameter of a pore, which is a region between surface elements protruding from a matte side of a copper foil is 1 nm to 100 nm.

A cross sectional area of the pores may range from 10% to 50% to an area of the matte side and the number of pores may range from 100 pores/μm$^2$ to 1000 pores/μm$^2$.

A ratio of an average density of the pores on the matte side and an average density of the surface elements protruding from the matte side may be 10% to 50%.

Glossiness (Gs)(60°) in a width direction of a matte side of copper may be equal to or more than 500.

Tensile strength before heat treatment of the electrolytic copper foil may range from 40 kgf/mm$^2$ to 70 kgf/mm$^2$ and the tensile strength after the heat treatment may range from 40 kgf/mm$^2$ to 70 kgf/mm$^2$ The heat treatment may be performed at 180° C. for 1 hour. The tensile strength after heat treatment may range from 85% to 99% of the tensile strength before the heat treatment.

In the electrolytic copper foil, the elongation before the heat treatment may range from 2% to 15% and the elongation after the heat treatment may range from 4% to 15%. The heat treatment may be performed at 180° C. for 1 hour. The elongation after the heat treatment may be 1 time to 4.5 times as large as the elongation before the heat treatment.

A corner curl angle of the electrolytic copper foil may range from 0° to 45°, a corner curl height thereof may range from 0 mm to 40 mm, and a thickness thereof may range from 2 μm to 10 μm.

In accordance with another aspect of the present invention, there is provided a battery including the electrolytic copper foil as described above.

In accordance with still another aspect of the present invention, an electric component includes: an insulating substrate; and the electrolytic copper foil attached on one surface of the insulating substrate.

It is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF SPECIFIC EMBODIMENTS

Hereinafter, an electrolytic copper foil, an electric component including the electrolytic copper foil, and a battery, and a method for manufacturing the electrolytic copper foil according to exemplary embodiments of the present invention will be described in more detail.

In the electrolytic copper foil according to the exemplary embodiment of the present invention, an average diameter of a pore, which is a region between surface elements protruding from the matte side ranges from 1 nm to 100 nm. In the electrolytic copper foil according to the exemplary embodiment of the present invention, an average diameter of a pore which is a dark portion appearing on the matte side, that is, a dark portion which is present between two surface elements is as small as a unit of nm. In the present specification, the 'surface element' means a portion protruding on the surface of the electrolytic copper foil which is a bright portion which appears on the matte side and the 'pore' means a portion which seems dark as a portion which is formed between the surface elements protruding upwardly from the surface of the electrolytic copper foil and is led thereinto.

In the electrolytic copper foil according to the exemplary embodiment of the present invention, the glossiness (GS (60°)) in a width direction of the matte side may be equal to or more than 500. That is, the glossiness of the matte side of the electrolytic copper foil is very high. The electrolytic copper foil is obtained by supplying a current between a rotating cathode drum and an anode which are dipped in a copper electrolyte bath to precipitate a copper foil on a surface of the cathode drum and a surface contacting the cathode drum in the electrolytic copper foil is called a shiny side (S side) and a surface opposite thereto is called a matte side. Unlike the shiny side contacting the drum, the matte side is a side at which the electrolyzed copper foil is precipitated as it is and therefore has less gloss and high surface roughness. Therefore, the matte side is subjected to post-processing to lower the surface roughness and processing for allocating gloss if necessary.

Figure 1:
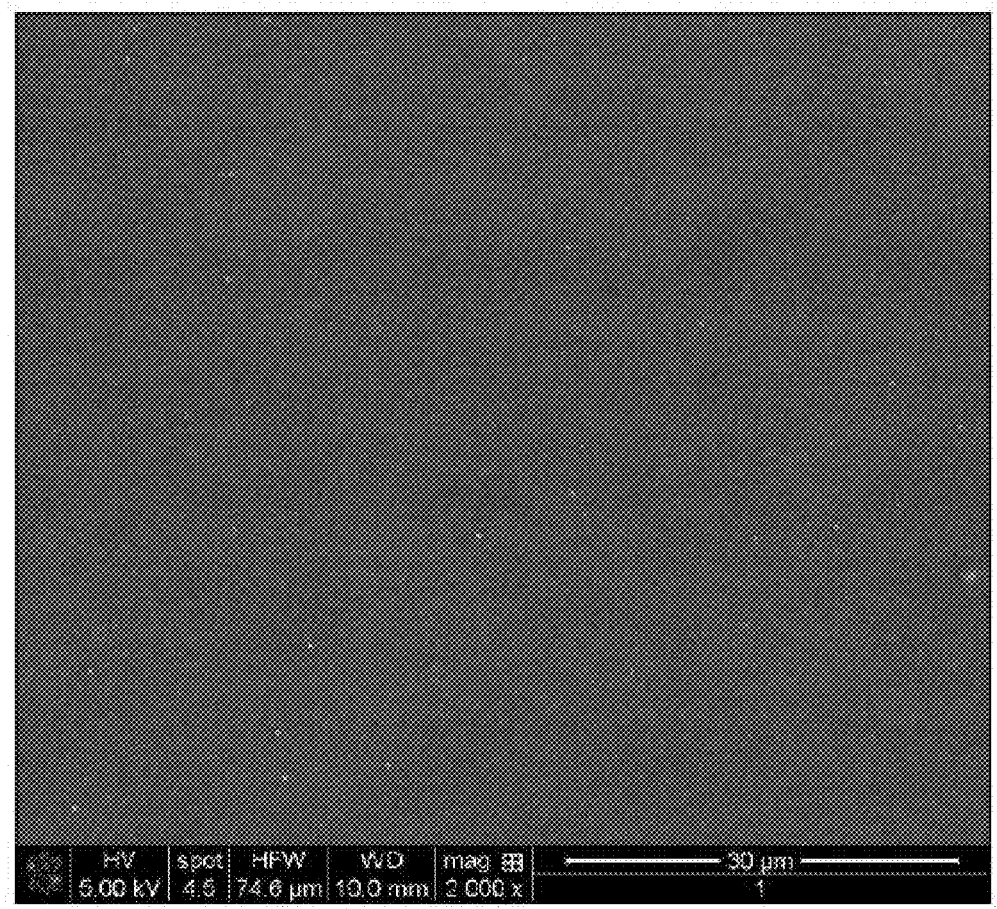
FIG. 1 is an electrolytic copper foil image taken with a field emission scanning electron microscopy (FESEM) with a magnifying power of 2,000 according to an exemplary embodiment of the present invention.

However, the glossiness of the matte side of the electrolytic copper foil according to the exemplary embodiment of the present invention is high. FIG. 1 is an electrolytic copper foil image taken with a field emission scanning electron microscopy (FESEM) with a magnifying power of 2,000 according to an exemplary embodiment of the present invention.

In FIG. 1, the matte side of the electrolytic copper foil according to the exemplary embodiment of the present invention shows glossiness like a mirror similar to the shiny side.

Figure 2:
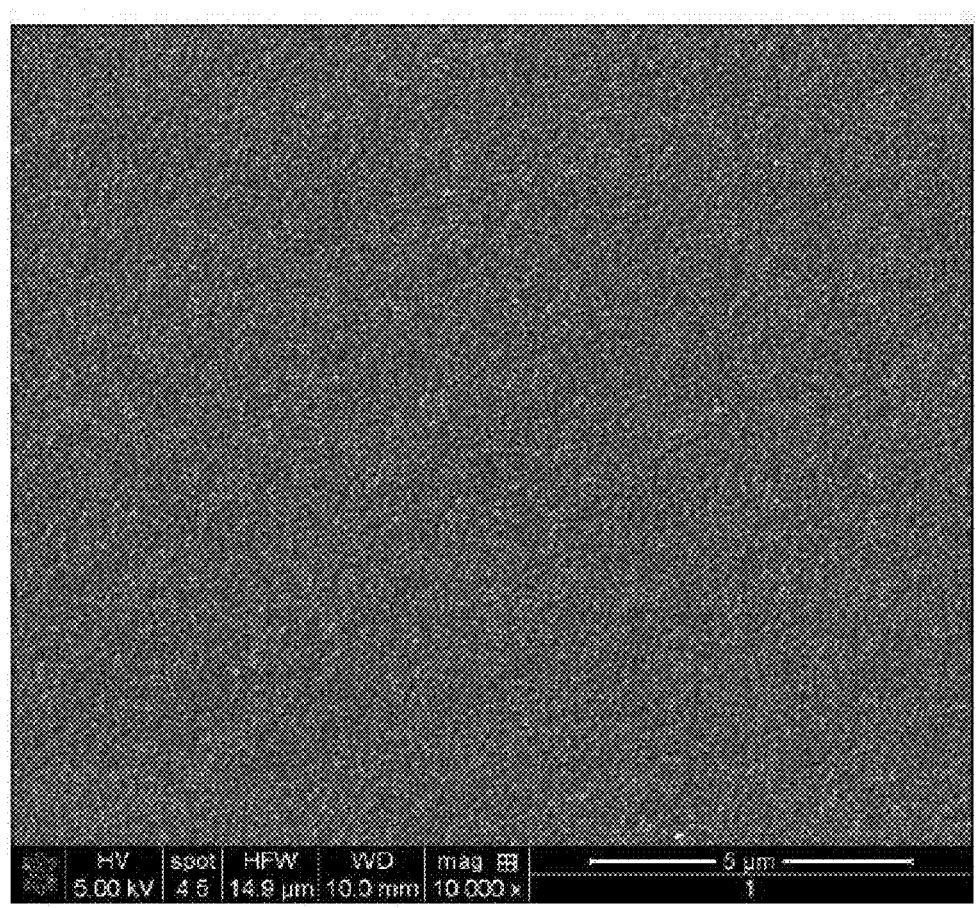
FIG. 2 is an electrolytic copper foil image taken with a FESEM with a magnifying power of 10,000 according to the exemplary embodiment of the present invention.
Figure 3:
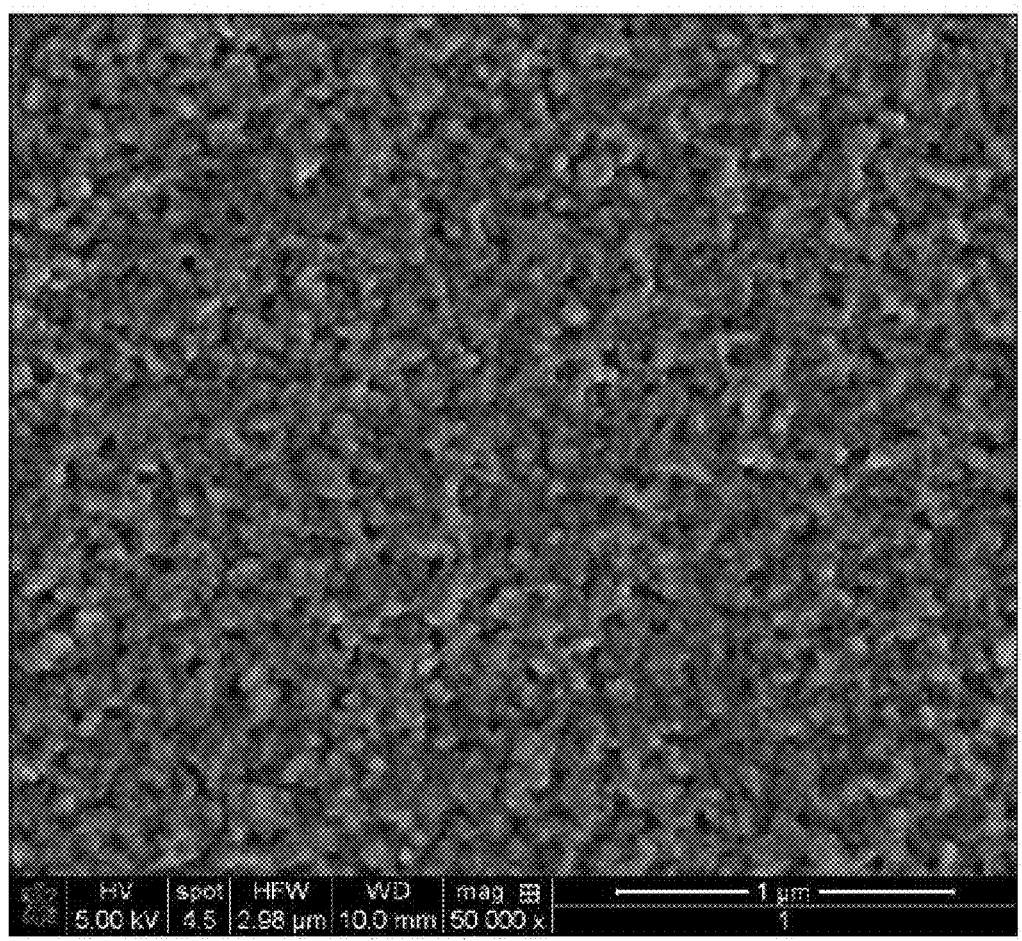
FIG. 3 is an electrolytic copper foil image taken with a FESEM with a magnifying power of 50,000 according to the exemplary embodiment of the present invention.
Figure 4:
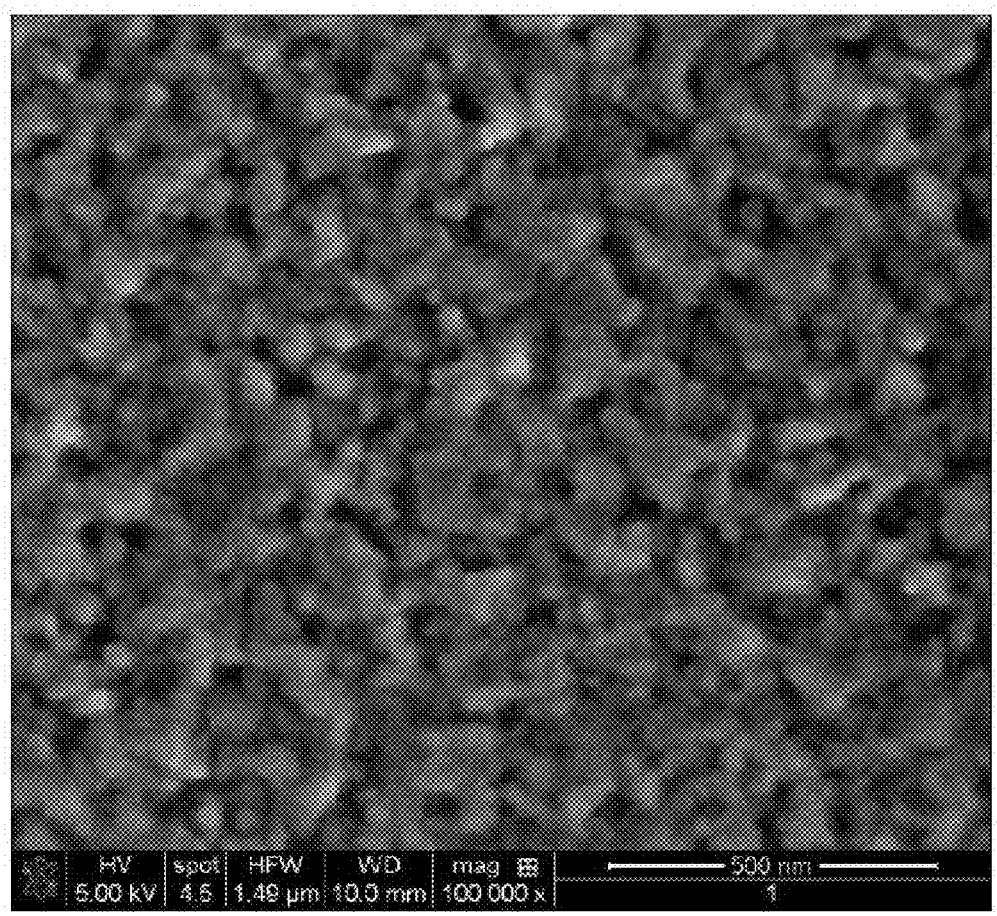
FIG. 4 is an electrolytic copper foil image taken with a FESEM with a magnifying power of 100,000 according to the exemplary embodiment of the present invention.

As a result of analyzing an image of the FESEM with a magnifying power of 10,000 of FIG. 2, an image of the FESEM with a magnifying power of 50,000 of FIG. 3, and an image of the FESEM with a magnifying power of 100,000 of FIG. 4 by increasing resolution of the FESEM analysis, as the resolution is increased, the ruggedness appears on the surface. However, it is difficult to confirm the ruggedness in the image of the FESEM with a magnifying power of 10,000 but the ruggedness starts to be confirmed in ultrahigh resolution like the analysis of the FESEM with a magnifying power of 50,000 and the analysis of the FESEM with a magnifying power of 100,000.

Figure 5:
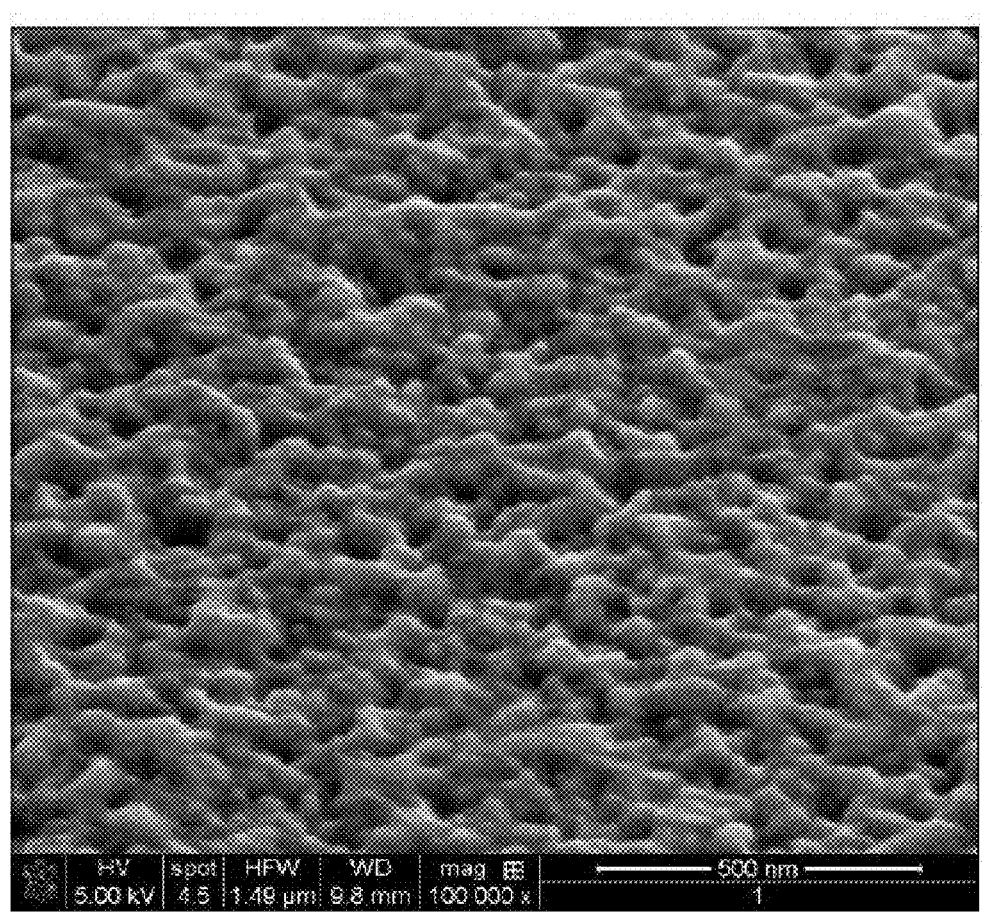
FIG. 5 is an electrolytic copper foil image of the FESEM with a magnifying power of 100,000 according to the exemplary embodiment of the present invention.

In the image of the FESEM with a magnifying power of 100,000 of FIG. 4, the pore which is a region between the surface elements protruding from the matte side of the electrolytic copper foil appears. In FIG. 4, in the electrolytic copper foil according to the exemplary embodiment of the present invention, the size and a height of the surface element of the matte side are uniform and the size and the density of the pore between the surface elements protruding outwardly from the matte side are relatively small. The result of performing the analysis of the FESEM image with a magnifying power of 100,000 on the same sample which is tilted by 50° is shown in FIG. 5. In FIG. 5, the pore between the protruding surface elements more clearly appears.

Even when the surface has the same surface roughness, in the case in which the size of the pore is small or the number of pores is small, the surface glossiness is improved. For example, when volumes of the pores at the matte side are the same, if a depth of the pore is low and an average diameter thereof is large, the pore which is the dark region appearing on the surface may greatly affect the glossiness. That is, if the volumes of the pores are the same but the depth of the pore is deep and the average diameter thereof is small, the glossiness may be improved.

Therefore, if the pore on the matte side of the electrolytic copper foil according to the exemplary embodiment of the present invention has a relatively deeper depth and a relatively smaller average diameter, the glossiness is more improved. Considering the fact that the surface roughness Rz on the matte side is equal to or less than 1.4 μm, the fact that the average diameter of the pore ranges from 1 nm to 100 nm means that the depth of the port is deep to prevent the dark portion of the pore from being largely exposed on the matte side.

Further, the pore may have a cross sectional area of 10% to 50% compared with the whole area of the matte side. This means that it is preferable that the pore has an area of 50% or less compared with the whole area of the matte side. Further, a ratio of an average number density of the pores on the matte side and an average number density of the protruding surface elements on the matte side may be 10% to 50%. It is preferable that the number of pores is smaller than the number of protruding surface elements in terms of the glossiness. Further, the number of pores may be 100 pores/μm$^2$ to 1000 pores/μm$^2$.

The cross sectional area of the pore may be calculated by dividing the whole width of the dark region from the image of FIG. 3 or FIG. 4 by the number of pores.

In the electrolytic copper foil according to one implementation example, the surface roughness Rz of the matte side is equal to or less than 1.4 μm and after heat treatment, tensile strength is equal to or more than 40 kgf/mm$^2$ and elongation is equal to or more than 4%.

The electrolytic copper foil is a low-roughness foil copper having a surface roughness Rz which is equal to or less than 1.4 μm but has high tensile strength which is equal to or more than 40 kgf/mm$^2$, such that the electrolytic copper foil has high mechanical strength. Simultaneously therewith, the electrolytic copper foil has high elongation of 4% or more even after being subjected to high-temperature treatment.

Further, in the electrolytic copper foil according to the exemplary embodiment of the present invention, a corner curl angle ranges from 0° to 45°. The corner curl angle means how much an end, that is, a corner or an edge of the electrolytic copper foil is bent when the electrolytic copper foil is put on a flat floor. It is known that a corner curling phenomenon of the electrolytic copper foil occurs when the internal energy of the electrolytic copper foil is non-uniform. When the corner curling phenomenon occurs, many defects such as tearing of the corner during a stacking process in the PCB process may occur and defects such as tearing, folding, or wrinkling of the corner at the time of coating an active material in a process of a lithium secondary battery may occur. When the corner curl angle of the electrolytic copper foil is large, the electrolytic copper foil is hardly used in the subsequent process, and therefore the corner curl angle preferably ranges from 0° to 40°. Further, the electrolytic copper foil is spread on a flat floor and then is cut in an X letter. In this case, a protruding height of the cut portion is called a corner curling height, in which the corner curling height preferably ranges from 0 mm to 40 mm. In the case of the electrolytic copper foil according to the exemplary embodiment of the present invention, impurities are present in a copper crystal and thus strength is increased, such that the corner curling degree is expected to be large. However, since no impurities are present in a copper grain boundary, internal stress is reduced and the corner curling degree is reduced correspondingly.

Therefore, the electrolytic copper foil may be used in a a printed circuit board (PCB)/flexible PCB (FPC) or as a current collector of a battery.

In the electrolytic copper foil, when the surface roughness Rz of the matte side exceeds 1.4 μm, a contact surface between the surface of the electrolytic copper foil for the cathode current collector and the active surface is reduced and thus life of a charging and discharging cycle and electric capacity at the initial time of charging may be reduced. Further, when the surface roughness Rz of the matte side exceeds 1.4 μm, it is difficult to form a high-density circuit having a micro pitch on a print wiring board.

The electrolytic copper foil has tensile strength from 40 kgf/mm$^2$ to 70 kgf/mm$^2$ and therefore has a high strength property. Further, the electrolytic copper foil has tensile strength from 40 kgf/mm$^2$ to 70 kgf/mm$^2$ even after being subjected to heat treatment. The heat treatment may be performed at, for example, 150° C. to 220° C., in detail, 180° C. The heat treatment may be performed over the period of 30 minutes, 1 hour, 2 hours, and some hours, but when the heat treatment needs to be performed for 1 hour or more, the tensile strength may be maintained.

When the electrolytic copper foil is subjected to the heat treatment and then the tensile strength of the electrolytic copper foil is less than 40 kgf/mm$^2$, the mechanical strength is weak, such that the electrolytic copper foil may not easily be handled.

In the electrolytic copper foil, it is preferable that the tensile strength after the heat treatment is similar to the tensile strength before the heat treatment. The tensile strength of the electrolytic copper foil after the heat treatment preferably ranges from 85% to 99% of the tensile strength before the heat treatment. When the strength is maintained even after the heat treatment, the electrolytic copper foil may be easily handled in the subsequent process and the yield thereof may be increased.

In the electrolyte copper foil, the elongation before the heat treatment may range from 2% to 15%. Further, in the electrolyte copper foil, the elongation after the heat treatment may range from 4% to 15%, in which the heat treatment may be performed at 180° C. for 1 hour. Alternatively, the elongation after the heat treatment may be 1 time to 4.5 times as large as the elongation before the heat treatment.

In the electrolytic copper foil, if the elongation after the heat treatment is less than 4%, when the subsequent process is a high temperature process, cracks may occur. For example, when the electrolytic copper foil is used as the cathode current collector of a secondary battery, the process at the time of manufacturing the cathode current collector is a high temperature process and the change in volume of the active material layer is accompanied at the time of the charging and discharging, and therefore cracks may occur and defects may occur. Therefore, there is a need to maintain predetermined elongation after the heat treatment.

In the electrolytic copper foil, a ratio I(200)/(I)(111) of intensity (I(200)) of a diffraction peak for a (200) crystal face and intensity (I(111)) of the diffraction peak for a (111) crystal face in the XRD spectrum for the matte side may range from 0.5 to 1.0.

Figure 6:
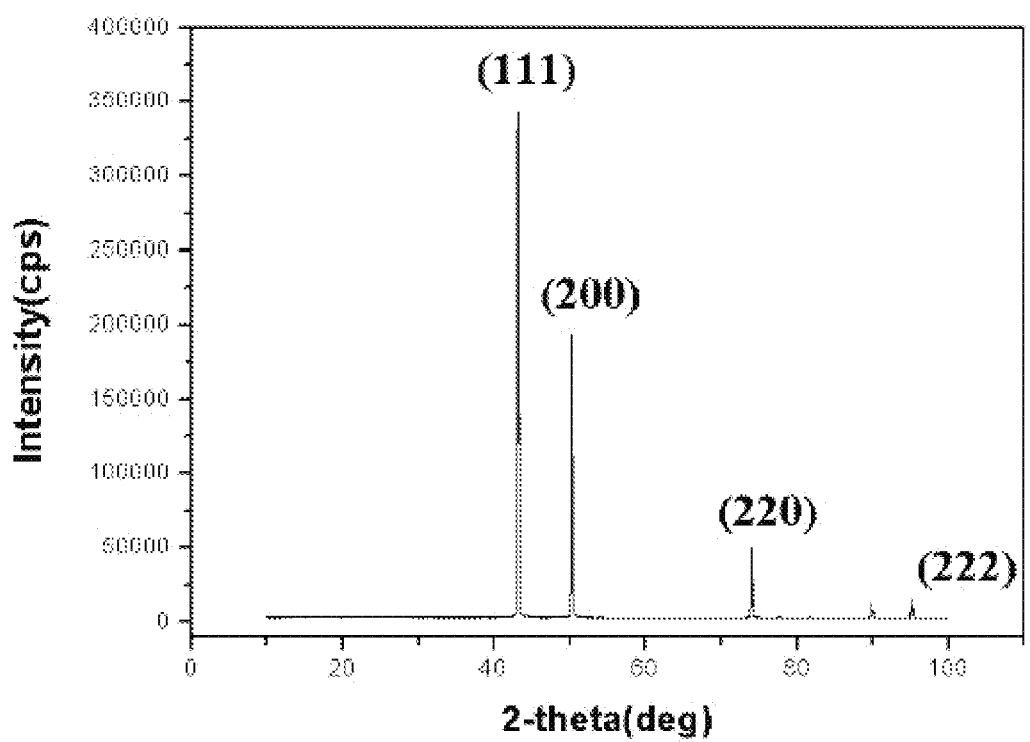
FIG. 6 is a X-ray diffraction (XRD) spectrum for a matte side of an electrolytic copper foil manufactured according to Example 1.

For example, as illustrated in FIG. 6, the diffraction peak for the (111) crystal face appears at the diffraction angle (2θ) 43.0°±1.0° and the diffraction peak for the (200) crystal face appears at the diffraction angle (2θ) 50.5°±1.0°, in the XRD spectrum for the matte side and the intensity ratio I(200)/I(111) thereof may range from 0.5 to 1.0 or more.

For example, in the electrolytic copper foil, I(200)/I(111) may range from 0.5 to 0.8. In the electrolytic copper foil, a ratio M(200)/M(111) of an orientation index which is obtained from an orientation index (M(200)) for the (200) crystal face and an orientation index (M(111)) for the (111) crystal face in the XRD spectrum for the matte side may range from 1.1 to 1.5. The orientation index is a value obtained by dividing the relative peak intensity of the specific crystal face for any sample by relative peak intensity of a characteristic crystal face obtained at a standard sample which is non-orientation for all the crystal faces. For example, in the electrolytic copper foil, M(200)/M(111) may range from 1.2 to 1.4.

In the electrolytic copper foil, after the heat treatment is performed at 180° C. for 1 hour, the elongation may be equal to or more than 10%. That is, the electrolytic copper foil may have high elongation which is equal to or more than 10% after the high-temperature heat treatment. For example, in the electrolytic copper foil, the elongation after the high-temperature heat treatment may range from 10% to 20%. For example, in the electrolytic copper foil, the elongation after the high-temperature heat treatment may range from 10% to 15%. For example, in the electrolytic copper foil, the elongation after the high-temperature heat treatment may range from 10% to 13%. In the electrolytic copper foil, the elongation before the heat treatment may be equal to or more than 2%. For example, in the electrolytic copperfoil, the elongation before the heat treatment may range from 2% to 20%. For example, in the electrolytic copper foil, the elongation before the heat treatment may range from 5% to 20%. For example, in the electrolytic copper foil, the elongation before the heat treatment may range from 5% to 15%. For example, in the electrolytic copper foil, the elongation before the heat treatment may range from 5% to 10%. The term "before the heat treatment" means 25° C. to 130° C. which is the temperature before the high-temperature heat treatment. The elongation is a value obtained by dividing a distance elongated just before the electrolytic copper foil is fractured by a first length of the electrolytic copper foil.

In the electrolytic copper foil, the surface roughness Rz of the matte side may be equal to or less than 0.7 µm. The electrolytic copper foil has low roughness Rz which is equal to or less than 0.7 µm and thus may be used as a copper foil for the PCB/FPC and a copper foil for the cathode current collector for the secondary battery. For example, in the electrolytic copper foil, the surface roughness Rz of the matte side may be equal to or less than 0.5 µm. For example, in the electrolytic copper foil, the surface roughness Rz of the matte side may be equal to or less than 0.45 µm.

In the electrolytic copper foil, a surface roughness Ra of the matte side may be equal to or less than 0.15 µm. The electrolytic copper foil has low roughness Ra which is equal to or less than 0.15 µm and thus may be used as a copper foil for the PCB/FPC and a copper foil for the cathode current collector for the secondary battery. For example, in the electrolytic copper foil, the surface roughness Ra of the matte side may be equal to or less than 0.12 µm. For example, in the electrolytic copper foil, the surface roughness Ra of the matte side may be equal to or less than 0.11 µm.

After the heat treatment of the electrolytic copper foil, the tensile strength may be equal to or more than 85% of the tensile strength before the heat treatment. For example, after the electrolytic copper foil is heat treated at 180° C. for 1 hour, the tensile strength may be equal to or more than 90% of the tensile strength before the heat treatment. The tensile strength before the heat treatment is the tensile strength of the copper foil obtained without the high-temperature heat treatment. The tensile strength before the heat treatment of the electrolytic copper foil may range from 40 kgf/mm² to 70 kgf/mm².

In the electrolytic copper foil, the glassiness (Gs(60°)) in a width direction of the matte side may be equal to or more than 500. For example, in the electrolytic copper foil, the glassiness (Gs(60°)) in a width direction of the matte side may range from 500 to 1000. The glossiness is a value measured depending on JIS Z 871-1997.

A thickness of the electrolytic copper foil may be equal to or less than 35 µm. For example, the thickness of the electrolytic copper foil may range from 6 to 35 µm. For example, the thickness of the electrolytic copper foil may range from 6 to 18 µm. Further, for example, the thickness of the electrolytic copper foil may range from 2 to 10 µm.

When the electrolytic copper foil needs not to be bonded to an insulating resin, and the like, to obtain adhesion at a commercial level or more, a surface treatment may be additionally performed. An example of the surface treatment on the copper foil may include any one of heat resistant treatment and chemical resistant treatment and chromate treatment, and silane coupling treatment, or a combination thereof, or the like and how to perform what surface treatment is selectively performed by those skilled in the art according to a resin used as an insulating resin or the process conditions.

The electric component according to the exemplary embodiment of the present invention includes an insulating substrate and the electrolytic copper foil attached on one surface of the insulating substrate and includes a circuit formed by etching the electrolytic copper foil.

The electric component may be a TAB tape, a printed circuit board (PCB), a flexible PCB (FPC), and the like but is not necessarily limited thereto, and therefore, any electric component which may be used in the art as one used by attaching the electrolytic copper foil on the insulating substrate may be used.

The battery according to the exemplary embodiment of the present invention includes the electrolytic copper foil. The electrolytic copper foil may be used as the cathode current collector of the battery but is not necessarily limited thereto and may be used as other components which are used in the battery. The battery is not particularly limited thereto and includes a primary battery and a secondary battery and as a battery using the electrolytic copper foil as the current collector like a lithium ion battery, a lithium polymer battery, a lithium air battery, and the like, any battery which may be used in the art may be used.

A method for manufacturing an electrolytic copper according to an exemplary embodiment of the present invention includes electrolyzing a copper electrolyte including an additive A, an additive B, an additive C, and an additive D, in which the additive A is at least one selected from a group consisting of a thiourea-based compound and a compound in which a heterocycle including nitrogen is connected to a thiol group, the additive B is sulfonic acid of a compound including a sulfur atom or a metal salt thereof, the additive C is nonionic water soluble polymer, and the additive D is a phenazinium-based compound.

The method for manufacturing an electrolytic copper foil may manufacture a low-roughness copper foil which has a thin thickness, high mechanical strength, and high elongation by including additives of new composition. The copper electrolyte may include chlorine (chlorine ion) having a concentration of 1 to 40 ppm. Since a small amount of chlorine ion is present in the copper electrolyte, the number of nucleation sites is increased at the initial time of the electroplating and thus a crystal grain is fine to suppress crystal growth at the time of heating precipitates of $CuCl_2$, which are formed at an interface of the grain boundary, at high temperature, thereby improving thermal stability at high temperature. When the concentration of chlorine ion is less than 1 ppm, the concentration of chlorine ion required in a sulfuric acid-copper sulfate electrolyte is insufficient, such that the tensile strength before the heat treatment may be reduced and the thermal stability at high temperature may be reduced. When the concentration of chlorine ion exceeds 40 ppm, the surface roughness of the matte side rises, and as a result, it is difficult to manufacture the low-roughness electrolytic copper foil, and therefore the tensile strength before the heat treatment may be reduced, and the thermal stability at high temperature may be reduced.

In the copper electrolyte, the content of the additive A may range from 1 to 10 ppm, the content of the additive B may range from 10 to 200 ppm, the content of the additive C may range from 5 to 40 ppm, and the content of the additive D may range from 1 to 10 ppm.

In the copper electrolyte, the additive A may improve manufacturing stabilization of the electrolytic copper foil and improve the strength of the electrolytic copper foil. When the content of the additive A is less than 1 ppm, the tensile strength of the electrolytic copper foil may be reduced and when the content of the additive A exceeds 10 ppm, the surface roughness of the matte side rises and thus it is difficult to manufacture the low-roughness electrolytic copper foil and the tensile strength of the electrolytic copper foil may be reduced.

In the copper electrolyte, the additive B may improve the surface gloss of the electrolytic copper foil. When the content of the additive B is less than 10 ppm, the gloss of the electrolytic copper foil may be reduced and when the content of the additive B exceeds 20 ppm, the surface roughness of the matte side rises and thus it is difficult to manufacture the low-roughness electrolytic copper foil and the tensile strength of the electrolytic copper foil may be reduced.

In the copper electrolyte, the additive C lowers the surface roughness of the electrolytic copper foil and the surface gloss thereof may be improved. When the content of the additive C is less than 5 ppm, the surface roughness of the matte side rises, and thus it is difficult to manufacture the low-roughness electrolytic copper foil and the gloss of the electrolytic copper foil may be reduced and when the content of the additive C exceeds 40 ppm, physical properties or appearance of the electrolytic copper foil may not almost be changed and the content of the additive C exceeding 40 ppm may be non-economic.

In the copper electrolyte, the additive D may serve to improve flatness of the surface of the electrolytic copper foil. When the content of the additive D is less than 1 ppm, the surface roughness of the matte side rises, and thus it is difficult to manufacture the low-roughness electrolytic copper foil and the gloss of the electrolytic copper foil may be reduced and when the content of the additive D exceeds 40 ppm, the precipitated state of the electrolytic copper foil may be instable and the tensile strength of the electrolytic copper foil may be reduced.

The thiourea-based compound may be at least one selected from a group consisting of diethylthiourea, ethylenethiourea, acetylenethiourea, dipropylthiourea, dibutylthiourea, N-trifluoroacetylthiourea, N-ethylthiourea, N-cyanoacetylthiourea, N-allylthiourea, o-tolylthiourea, N,N'-butylenethiourea, thiazolidinethiol, 4-thiazolinethiol, 4-methyl-2-pyrimidinethiol, and 2-thiouracil, but is not necessarily limited thereto, and therefore any thiourea-based compound which may be used as an additive in the art may be used. The compound in which the heterocycle including nitrogen is connected to the thiol group may be, for example, 2-mercapto-5-benzoimidazole sulfonic acid sodium salt, Sodium 3-(5-mercapto-1-tetrazolyl)benzene sulfonate, and 2-mercapto benzothiazole.

The sulfonic acid of a compound including a sulfur atom or the metal salt thereof may be, for example, at least one selected from the group consisting of Bis-(3-sulfopropyl) disulfide disodium salt (SPS), 3-mercapto-1-propanesulfonic acid (MPS), 3-(N, N-dimethyl-thio carbamoyl)-thio propane sulfonate sodium salt (DPS), 3-[(amino-imino-methyl)thio]-1-propane sulfonate sodium salt (UPS), o-ethyldithiocarbonato-S-(3-sulfopropyl) ester sodium salt (OPX), 3-(benzothiazolyl-2-mercapto)-propyl-sulfonic acid sodium salt (ZPS), ethylenedithiodipropylsulfonic acid sodium salt, thioglycolic acid, thiophosphoric acid-o-ethyl-bis-(ω-sulfopropyl)ester disodium salt, and thiophosphoric acid-tris-(ω-sulfopropyl)ester trisodium salt, but is not necessarily limited thereto, and therefore any sulfonic acid of a compound including a sulfur atom or a metal salt thereof which may be used as an additive in the art may be used.

The non-ionic water soluble polymer may be at least one selected from the group consisting of polyethylene glycol, poly glycerin, hydroxyethyl cellulose, carboxymethylcellulose, nonylphenol polyglycol ether, octane diol-bis-(polyalkylene glycol ether, ocatanol polyalkylene glycol ether, oleic acid polyglycol ether, polyethylenepropylene glycol, polyethylene glycol dimethyl ether, polyoxypropylene glycol, polyvinyl alcohol, β-naphthol polyglycol ether, stearic acid polyglycol eter, and stearyl alcohol polyglycol ether, but is not necessarily limited thereto, and therefore any water soluble polymer which may be used as an additive in the art may be used. For example, the polyethyleneglycol may be a molecular weight of 2000 to 20000.

The phenazinium-based compound may be at least one selected from the group consisting of Safranine-O, Janus Green B, and the like.

The temperature of the copper electrolyte which is used in the manufacturing method may range from 30 to 60° C. but is not necessarily limited thereto, and therefore may be properly controlled within a range which may achieve the stated objectives. For example, the temperature of the copper electrolyte may range from 40 to 50° C.

The current density which is used in the manufacturing method may range from 20 to 500 A/dm$^2$ but is not necessarily limited thereto, and therefore may be properly controlled within a range which may achieve the stated objectives. For example, the current density may range from 30 to 40 A/dm$^2$. The copper electrolyte may be the sulfuric acid-copper sulfate electrolyte. In the sulfuric acid-copper sulfate electrolyte, a concentration of the $Cu^{2+}$ may range from 60 g/L to 180 g/L, but is not necessarily limited thereto, and therefore may be properly controlled within a range which may achieve the above object. For example, the concentration of the $Cu^{2+}$ may range from 65 g/L to 175 g/L.

The copper electrolyte may be prepared by a known method. For example, the concentration of the $Cu^{2+}$ ion may be obtained by controlling an addition of copper ion or copper sulfate and a concentration of $SO_4^{+2}$ ion may be obtained by controlling an addition of sulfuric acid and copper sulfate.

The concentration of additives included in the copper electrolyte may be determined from an injection amount and a molecular weight of the additive injected into the copper electrolyte or may be determined by analyzing the additives included in the copper electrolyte by a known method such as column chromatography.

The electrolytic copper foil may be manufactured by a known method, except that the method for manufacturing an electrolytic copper foil uses the foregoing aforementioned copper electrolyte.

For example, the electrolytic copper foil may be manufactured by supplying the copper electrolyte between the surface of the cathode in a curved surface of titanium on a rotating titanium drum and an anode, electrolyzing it to precipitate the electrolytic copper foil on the surface of the anode, and continuously winding it.

Hereafter, although the present invention will be described in detail with reference to Inventive Example, the present invention is not limited thereto.

(Manufacturing of Electrolytic Copper Foil)

EXAMPLE 1

To manufacture the electrolytic copper foil by electrolysis, a 3L electrolytic bath system which may be circulated at 20 L/min was used and the temperature of the copper electrolyte was constantly maintained at 45° C. The anode used a pole plate of a dimensionally stable electrode (DSE) which has a thickness of 5 mm and a size of 10×10 cm$^2$ and the cathode used a titanium pole plate which has the same size and thickness as the anode.

To smoothly move the Cu$^{2+}$ ion, plating was performed in a current density of 35 A/dm$^2$ and the electrolytic copper foil having a thickness of 18 μm was manufactured.

A basic composition of the copper electrolyte is as follows.

CuSO$_4$.5H$_2$O: 250~400 g/L
H$_2$SO$_4$: 80~150 g/L

The copper electrolyte was added with the chlorine ion and the additives and the composition of the additives and the chlorine ion which are added was shown in the following Table 1. In the following Table 1, ppm is the same as mg/L.

Figure 7:
FIG. 7 is a scanning electron microscopy (SEM) image for a surface of the electrolytic copper foil manufactured according to Example 1.
Figure 8:
FIG. 8 is an SEM image for the matte surface of an electrolytic copper foil according to Example 2.
Figure 9:
FIG. 9 is an SEM image for the matte surface of an electrolytic copper foil according to Example 3.
Figure 10:
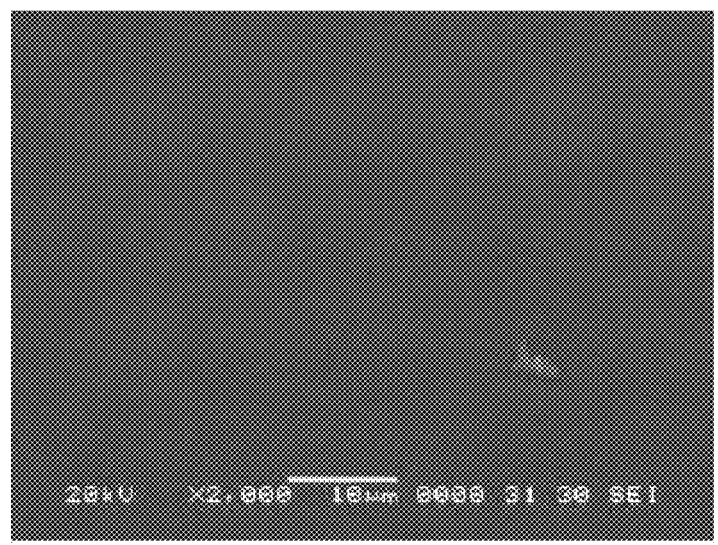
FIG. 10 is an SEM image for the matte surface of an electrolytic copper foil according to Example 4.
Figure 11:
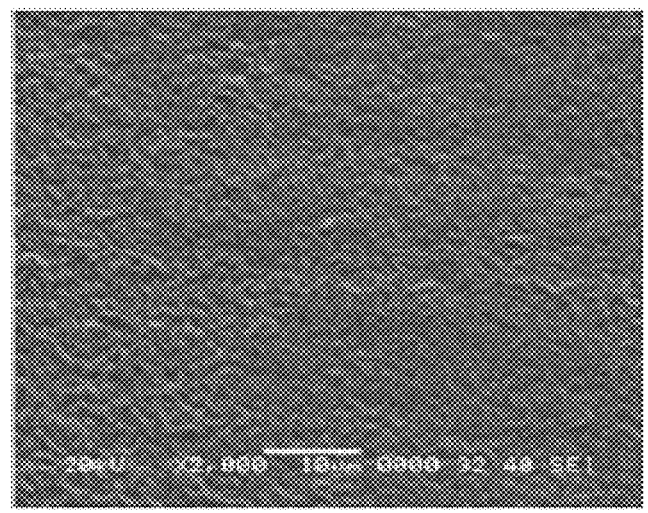
FIG. 11 is an SEM image for the matte surface of an electrolytic copper foil according to Comparative Example 1.
Figure 12:
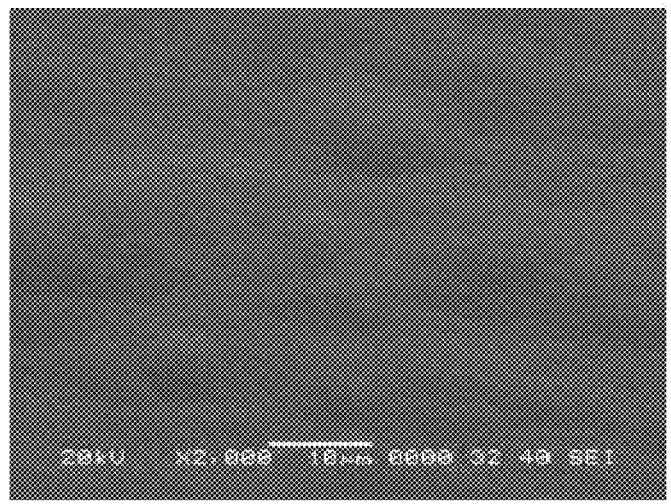
FIG. 12 is an SEM image for the matte surface of an electrolytic copper foil according to Comparative Example 2.
Figure 13:
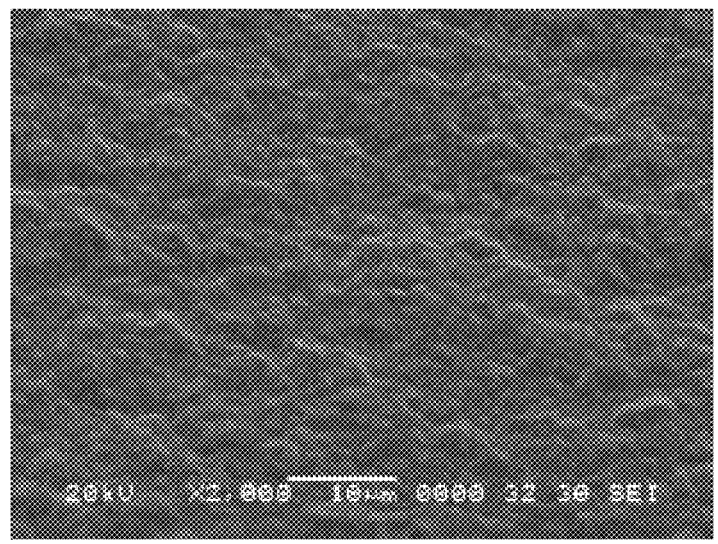
FIG. 13 is an SEM image for the matte surface of an electrolytic copper foil according to Comparative Example 3.
Figure 14:
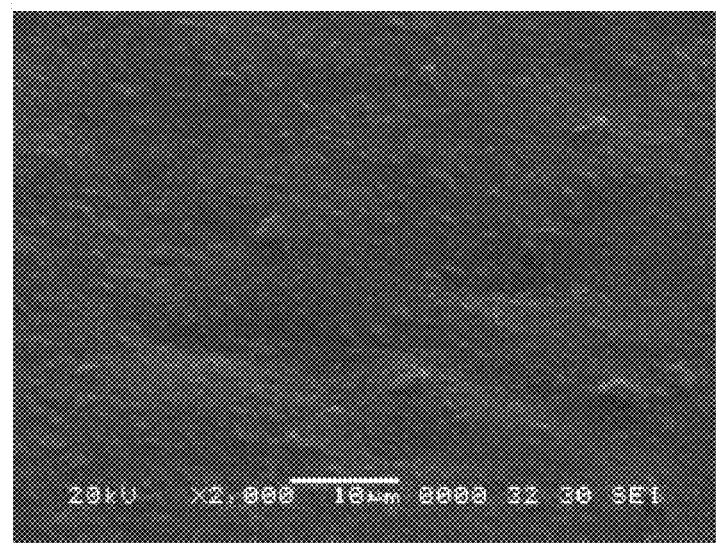
FIG. 14 is an SEM image for the matte surface of an electrolytic copper foil according to Comparative Example 4.

A photograph of a scanning electron microscopy for the matte side (M side) of the manufactured electrolytic copper foil was shown in FIG. 7.

EXAMPLES 2 TO 4 AND COMPARATIVE EXAMPLES 1 TO 4

The electrolytic copper foil was manufactured by the same method as Example 1, except that the composition of the copper electrolyte is changed like in the following Table 1. Photographs of the scanning electron microscopy for the surface of the matte side of the electrolytic copper foil manufactured in Examples 2 to 4 and Comparative Examples 1 to 4 were shown in FIGS. 8 to 14.

In the above Table 1, acronyms mean the following compounds.

DET: Diethyl thiourea
SPS: Bis-(3-sulfopropyl) disulfide
MPS: 3-mercapto-1-propanesulfonic acid
PEG: Polyethylene glycol (Kanto Chemical Cas No. 25322-68-3)
ZPS: 3-(benzothiazolyl-2-mercapto)-propyl-sulfonic acid sodium salt
JGB: Janus Green B
2M-SS: 2-mercapto-5-benzoimidazol sulfonic acid
DDAC: Diallyl dimethyl ammonium chloride
PGL: Polyglycerine (KCl, PGL 104KC)

EVALUATION EXAMPLE 1

Experiment of Scanning Electron Microscopy

The surface of the matte side of the electrolytic copper foil obtained in Examples 1 to 4 and Comparative Examples 1 to 4 was measured by the scanning electron microscopy and the measured results were each shown in FIGS. 7 to 14.

As illustrated in FIGS. 7 to 14, the surface of the electrolytic copper foil of Examples 1 to 4 has flatness and roughness lower than that of the electrolytic copper foil of Comparative Examples 1 to 4.

EVALUATION EXAMPLE 2

Measurement of Glossiness

The glossiness for the surface of the matte side of the electrolytic copper foil obtained in Examples 1 to 4 and Comparative Examples 1 to 4 was measured. The glossiness is a value measured depending on JIS Z 871-1997.

The glossiness was measured by the JIS Z 8741-1997 which is the glossiness measurement method of irradiating measured light to the surface of the copper foil at 60° along the flowing direction (MD direction) of the electrolytic copper foil and measuring the intensity of light reflected at a reflecting angle of 60°.

The measured results were shown in the following Table 2.

TABLE 2

|  | Glossiness [Gs (60°)] |
| --- | --- |
| Example 1 | 700 |
| Example 2 | 699 |

TABLE 1

|  | Example 1 | Example 2 | Example 3 | Example 4 | Comparative Example 1 | Comparative Example 2 | Comparative Example 3 | Comparative Example 4 |
| --- | --- | --- | --- | --- | --- | --- | --- | --- |
| Chlorine Concentration [ppm] | 20 | 20 | 20 | 20 | 40 | 40 | 35 | 40 |
| DET [ppm] | 3 | 2 | 3 | 3 |  |  | 1.5 | 7 |
| SPS [ppm] | 60 | 45 |  | 45 | 55 | 55 |  |  |
| MPS [ppm] |  |  | 60 |  |  |  | 5 | 20 |
| PEG [ppm] | 20 | 20 | 20 | 20 |  |  |  |  |
| ZPS [ppm] | 40 | 10 | 40 | 30 |  |  |  |  |
| JGB [ppm] |  | 3 |  |  |  |  |  |  |
| SAO [ppm] | 3 |  | 3 | 3 |  |  |  |  |
| SM-SS [ppm] |  |  |  |  | 30 | 40 |  |  |
| DDAC [ppm] |  |  |  |  | 70 | 70 |  |  |
| PGL [ppm] |  |  |  |  |  |  | 30 | 10 |

TABLE 2-continued

| | Glossiness [Gs (60°)] |
|---|---|
| Example 3 | 630 |
| Example 4 | 680 |
| Comparative Example 1 | 438 |
| Comparative Example 2 | 472 |
| Comparative Example 3 | 353 |
| Comparative Example 4 | 451 |

As shown in the above Table 2, the electrolytic copper foil of Examples 1 to 4 has more improved glossiness than that of Comparative Example 1 to 4.

EVALUATION EXAMPLE 3

XRD Experiment

The X-ray diffraction spectrum for the matte side of the electrolytic copper foil obtained in Examples 1 to 4 and Comparative Examples 1 to 4 was measured. The XRD spectrum for Example 1 was shown in FIG. 6.

As illustrated in FIG. 6, the peak intensity of the (111) crystal face is highest and the (200) crystal face has the second highest peak intensity.

The I(200)/I(111) which is the ratio of the intensity (I(200)) of the diffraction peak for the (200) crystal face and the intensity (I(111)) of the diffraction peak for the (111) crystal face was 0.605.

Further, the orientation index M for the (111), (200), (220), (311), (222) crystal faces was measured in the XRD spectrum for the matte side and the measured result was shown in the following Table 3.

The orientation index was measured by the orientation index (M) which is proposed in S. Yoshimura, S. Yoshihara, T. Shirakashi, E. Sato, Electrochim. Acta 39, 589(1994).

For example, in the case of a sample having the (111) face, the orientation index (M) is calculated by the following method.

$$IFR(111)=IF(111)/\{IF(111)+IF(200)+IF(220)+IF(311)\}$$

$$IR(111)=I(111)/\{I(111)+I(200)+I(220)+I(311)\}$$

$$M(111)=IR(111)/IFR(111)$$

The IF (111) is the XRD intensity in JCPDS cards and the I(111) is an experiment value.

When the M(111) is larger than 1, it has a preferred orientation parallel with the (111) face and when the M is smaller than 1, the preferred orientation is reduced.

TABLE 3

| | Crystal face | | | | |
|---|---|---|---|---|---|
| | (111) | (200) | (220) | (311) | (222) |
| Orientation Index | 1.02 | 1.34 | 0.80 | 0.25 | 0.97 |

Referring to the above Table 3, the M(200)/M(111) which is the ratio of the orientation index (M(200)) for the (200) crystal face in the XRD spectrum for the matte side and the orientation index obtained from the orientation index (M(111)) for the (111) crystal face was 1.31.

EVALUATION EXAMPLE 4

Measurement of Surface Roughness (Rz)

The surface roughness Rz and Ra of the matte side and the shiny side of the electrolytic copper foil obtained in Examples 1 to 4 and Comparative Examples 1 to 4 were measured by JISB 0601-1994 standard. The surface roughness Rz and Ra obtained by the measurement method were shown in the following Table 4. The lower the value, the lower the roughness.

EVALUATION EXAMPLE 5

Measurement of Tensile Strength at Room Temperature, Elongation at Room Temperature, Tensile Strength at High Temperature, and Elongation at High Temperature In the electrolytic copper foil obtained in Examples 1 to 4 and Comparative Examples 1 to 4, the maximum load of the tensile strength measured by acquiring a tensile sample 12.7 mm in width×50 mm in gauge length and then performing a tensile test at a crosshead speed of 50.8 mm/min using IPC-TM-650 2.4.18B standard was called the tensile strength at room temperature and the elongation at the time of fracture was called the elongation at room temperature. Here, the room temperature is 25° C.

The same electrolytic copper foil as the electrolytic copper foil which was used to measure the tensile strength and the elongation at room temperature was heat treated at 180° C. for 1 hour and was taken out and then the tensile strength and the elongation of the electrolytic copper foil were measured, which was called the tensile strength and the elongation at high temperature.

The tensile strength and the elongation at room temperature and the tensile strength and the elongation at high temperature which were obtained by the measurement method were shown in the following Table 4.

TABLE 4

| | Surface roughness on matte side | | Tensile strength at room temperature [kgf/mm²] | Elongation at room temperature [%] | Tensile strength at high temperature [kgf/mm²] | Elongation at high temperature [%] |
|---|---|---|---|---|---|---|
| | Rz [μm] | Ra [μm] | | | | |
| Example 1 | 0.30 | 0.08 | 46.15 | 7.21 | 43.30 | 11.63 |
| Example 2 | 0.28 | 0.07 | 42.28 | 5.00 | 40.16 | 12.06 |
| Example 3 | 0.38 | 0.10 | 45.41 | 6.16 | 41.55 | 9.38 |
| Example 4 | 0.44 | 0.11 | 44.74 | 6.62 | 40.78 | 10.53 |
| Comparative Example 1 | 0.67 | 0.16 | 86.65 | 2.18 | 77.91 | 3.30 |
| Comparative Example 2 | 0.48 | 0.10 | 98.76 | 1.30 | 92.30 | 1.74 |

TABLE 4-continued

| | Surface roughness on matte side | | Tensile strength at room temperature [kgf/mm²] | Elongation at room temperature [%] | Tensile strength at high temperature [kgf/mm²] | Elongation at high temperature [%] |
|---|---|---|---|---|---|---|
| | Rz [μm] | Ra [μm] | | | | |
| Comparative Example 3 | 1.46 | 0.24 | 52.81 | 1.64 | 49.53 | 1.87 |
| Comparative Example 4 | 1.38 | 0.25 | 70.73 | 1.71 | 64.30 | 1.47 |

As illustrated in the above Table 4, the electrolytic copper foil in Examples 1 to 4 has the surface roughness Rz lower than 0.5 μm, and after the electrolytic copper foil is heat treated at high temperature, the tensile strength of the electrolytic copper foil is equal to or more than 40 kgf/mm² and after the electrolytic copper foil is heat treated at high temperature, most of the elongation thereof is equal to or more than 10%.

As compared therewith, the electrolytic copper foil of Comparative Examples 1 to 4 has the surface roughness higher than that of Examples 1 to 4 and after the electrolytic copper foil is heat treated at high temperature, the elongation of the electrolytic copper foil is low and therefore the electrolytic copper foil is inappropriate for the cathode current collector for the secondary battery and/or the low-roughness copper foil for the PDB/FPC.

EVALUATION 6

Measurement of Corner Curling Degree

In the electrolytic copper foil obtained in Examples 1 to 4 and Comparative Examples 1 to 4, a sample of 10 cm in width×10 cm in length was acquired and then the sample was put on the flat floor and was cut. Thereafter, an angle (corner curl angle) at which the corner portion is bent and then a protruding height (corner curl height) of the portion cut in an X were measured and the measured results were shown in the following Table 5.

TABLE 5

| | Corner curl angle (°) | Corner curl height (mm) |
|---|---|---|
| Example 1 | 5 | 4 |
| Example 2 | 15 | 12 |
| Example 3 | 8 | 6 |
| Example 4 | 30 | 26 |
| Comparative Example 1 | 52 | 48 |
| Comparative Example 2 | 48 | 44 |
| Comparative Example 3 | 46 | 43 |
| Comparative Example 4 | 50 | 46 |

As shown in Table 5, the corner curl angle of the electrolytic copper foil of Examples 1 to 4 was equal to or less than 45° as 5 to 30°. However, the corner curl angle of the electrolytic copper foil of Comparative Examples 1 to 4 exceeds 45° as 46° to 52° and therefore the electrolytic copper foil may not be easily handled in the subsequent process. Further, the corner curl height of the electrolytic copper foil of Comparative Examples 1 to 4 exceeds 40 mm and thus the quality of the electrolytic copper foil was poor. Therefore, the electrolytic copper foil according to the exemplary embodiment of the present invention has high strength and reduced internal stress which reduces the corner curling phenomenon, and as a result, has excellent performance.

According to the electrolytic copper foil in accordance with the exemplary embodiments of the present invention, the size and the density of the pore between the surface elements protruding outwardly from the matte side are relatively small and thus the high glossiness appears even before the post-processing process, thereby improving the product quality. Further, according to the exemplary embodiments of the present invention, the electrolytic copper foil has the reduced stress inside the electrolytic copper foil while having the high strength and the high elongation to prevent the corner curling phenomenon. Therefore, according to the exemplary embodiments of the present invention, the electrolytic copper foil has the low roughness, the high strength, and the high elongation to facilitate the process performance and reduce the product defect rate, and the electrolytic copper foil is used in products such as the PCB and the cathode current collector of the secondary battery to improve the product reliability.

While the present invention has been shown and described in connection with the embodiments, it will be apparent to those skilled in the art that modifications and variations can be made without departing from the spirit and scope of the invention as defined by the appended claims. Further, those skilled in the art will appreciate that various modifications, additions and substitutions are possible, without departing from the scope and spirit of the invention as disclosed in the accompanying claims.

We claim:

1. An electrolytic copper foil, wherein
glossiness (Gs (60°)) in a width direction of a matte side of copper is equal to or more than 500,
the surface roughness Rz which is equal to or less than 1.4 μm,
an average diameter of pores on the matte side ranges from 1 nm to 100 nm, and
a number of distributed pores ranges from 100 pores/μm² to 1000 pores/μm², wherein an average density of pores on the matte side ranges from 10% to 50% of an average density of surface elements protruding from the matte side, and
wherein the pores are recesses and the surface elements are projections.

2. The electrolytic copper foil of claim 1, wherein a cross sectional area of the pores ranges from 10% to 50% to an area of the matte side.

3. The electrolytic copper foil of claim 1, wherein the tensile strength before heat treatment ranges from 40 kgf/mm² to 70 kgf/mm².

4. The electrolytic copper foil of claim 1, wherein the tensile strength after heat treatment ranges from 40 kgf/mm² to 70 kgf/mm².

5. The electrolytic copper foil of claim 1, wherein the tensile strength after heat treatment at 180° C. for 1 hour ranges from 40 kgf/mm² to 70 kgf/mm² or more.

6. The electrolytic copper foil of claim 1, wherein the tensile strength after heat treatment ranges from 85% to 99% of the tensile strength before the heat treatment.

7. The electrolytic copper foil of claim 1, wherein the elongation before heat treatment ranges from 2% to 15%.

8. The electrolytic copper foil of claim 1, wherein the elongation after heat treatment ranges from 4% to 15%.

9. The electrolytic copper foil of claim 1, wherein the elongation after heat treatment at 180° C. for 1 hour ranges from 4% to 15%.

10. The electrolytic copper foil of claim 1, wherein the elongation after heat treatment is 1 time to 4.5 times as large as the elongation before the heat treatment.

11. The electrolytic copper foil of claim 1, wherein a corner curl angle ranges from 0° to 45°.

12. The electrolytic copper foil of claim 1, wherein a corner curl height ranges from 0 mm to 40 mm.

13. The electrolytic copper foil of claim 1, wherein a thickness of the electrolytic copper foil ranges from 2 μm to 10 μm.

14. A battery including the electrolytic copper foil of claim 1.

15. An electric component, comprising:
an insulating substrate; and
the electrolytic copper foil of claim 1 attached on one surface of the insulating substrate.

* * * * *